United States Patent [19]
Delia et al.

[11] Patent Number: 6,018,458
[45] Date of Patent: Jan. 25, 2000

[54] CONSTANT IMPEDANCE AIR BAFFLE FOR COOLING OF ELECTRONIC CARD ASSEMBLIES

[75] Inventors: David J. Delia, Poughkeepsie; Peter W. Kelly, Stone Ridge; William D. McClafferty, New Paltz; Roger R. Schmidt, Poughkeepsie, all of N.Y.

[73] Assignee: International Business Machines Corporation, Armonk, N.Y.

[21] Appl. No.: 09/063,850

[22] Filed: Apr. 21, 1998

[51] Int. Cl.[7] ...................................................... H05K 7/20
[52] U.S. Cl. .......................... 361/690; 361/687; 361/692; 361/695; 361/720; 165/80.3; 312/223.2
[58] Field of Search ............................ 361/687, 690–695, 361/715, 716, 720–722, 724–730; 165/80.3; 174/16.1

[56] References Cited

U.S. PATENT DOCUMENTS

| | | |
|---|---|---|
| 4,399,485 | 8/1983 | Wright et al. ............................ 361/383 |
| 4,730,233 | 3/1988 | Osterman ................................. 361/383 |
| 5,523,917 | 6/1996 | Searby ..................................... 361/687 |
| 5,680,294 | 10/1997 | Stora et al. .............................. 361/695 |

*Primary Examiner*—Leo P. Picard
*Assistant Examiner*—Boris Chervinsky
*Attorney, Agent, or Firm*—Floyd A. Gonzalez

[57] ABSTRACT

A constant impedance air baffle assembly having two spaced apart generally parallel plates, each having a plurality of through holes for placing in line with a plurality of circuit cards to be cooled. The circuit cards are mounted on one side of a printed circuit board, and arranged in varying numbers and placements, depending on the number of cards desired. The air baffles provide a constant impedance to the air flow over the cards such that air does not bypass other components that need to be cooled when the circuit cards are removed. Further, the baffle plates include hanger tabs which may be hung over the edge of a printed circuit board to hold the parallel plates in place. The hanger tabs further include spacing slots for holding a pair of side-by-side printed circuit boards apart such that the printed circuit boards upon which said air baffle is hung cannot flex and short the pins on the backs thereof together.

4 Claims, 4 Drawing Sheets

CONSTANT IMPEDANCE AIR BAFFLE FOR COOLING OF ELECTRONIC CARD ASSEMBLIES

The present invention is related to providing constant air impedance in the air cooling system for electronic card assemblies, and is more particularly related to cooling systems for memory card assemblies in a electronic computer.

BACKGROUND OF THE INVENTION

Cards holding electronic components in an electronic computer are many times cooled by driving air over the cards to be cooled. Many times, printed circuit boards are designed such that a variable number of cards to be cooled may by attached thereto. The air volume that passes over the cards to be cooled may vary significantly depending on the number of cards installed. If there is a small number of cards installed, the resistance to air traveling over the cards is reduced, which may allow a larger volume of air to pass, reducing air volume over other areas which need to be cooled, thus unbalancing the air cooling system such that some elements may not receive the air needed to sufficiently cool them.

U.S. Pat. No. 4,399,485 issued Aug. 16, 1983 to Wright et al. for AIR BAFFLE ASSEMBLY FOR ELECTRONIC CIRCUIT MOUNTING FRAME discloses a variable width baffle assembly which may be folded between two spaced apart circuit boards to maintain a constant, uniform impedance to the flow of cooling air across a vacant space on a partially populated electronic mounting frame for printed circuit board assemblies.

U.S. Pat. No. 4,730,233 issued Mar. 8, 1988 to Osterman for ARRANGEMENT IN COOLING CIRCUIT BOARDS discloses a arrangement for cooling circuit boards which are accommodated in magazines. Each magazine is assigned a regulator plate having a plurality of through holes the sizes and position of which are selected such that air flow may be adjusted to the cooling needs of the board being cooled.

SUMMARY OF THE INVENTION

The present invention provides a constant impedance air baffle assembly having two spaced apart generally parallel plates, each having a plurality of through holes for placing in line with the circuit cards to be cooled. The circuit cards are on one side of a printed circuit board, and are arranged in varying numbers and placements, depending on the number of cards desired. The air baffles provide a constant impedance to the air flow over the cards such that air does not bypass other components that need to be cooled when the circuit cards are removed. Further, the baffle plates include hanger tabs which may be hung over the edge of the printed circuit board to hold the parallel baffle plates in place. The hanger tabs further include spacing slots for holding a pair of printed circuit boards apart such that the printed circuit boards cannot flex and short the pins on the back thereof together.

The foregoing and other objects, features and advantages of the invention will be apparent from the following more particular description of the preferred embodiment of the invention as illustrated in the drawings.

DESCRIPTION OF THE PREFERRED EMBODIMENT

Figure 1:
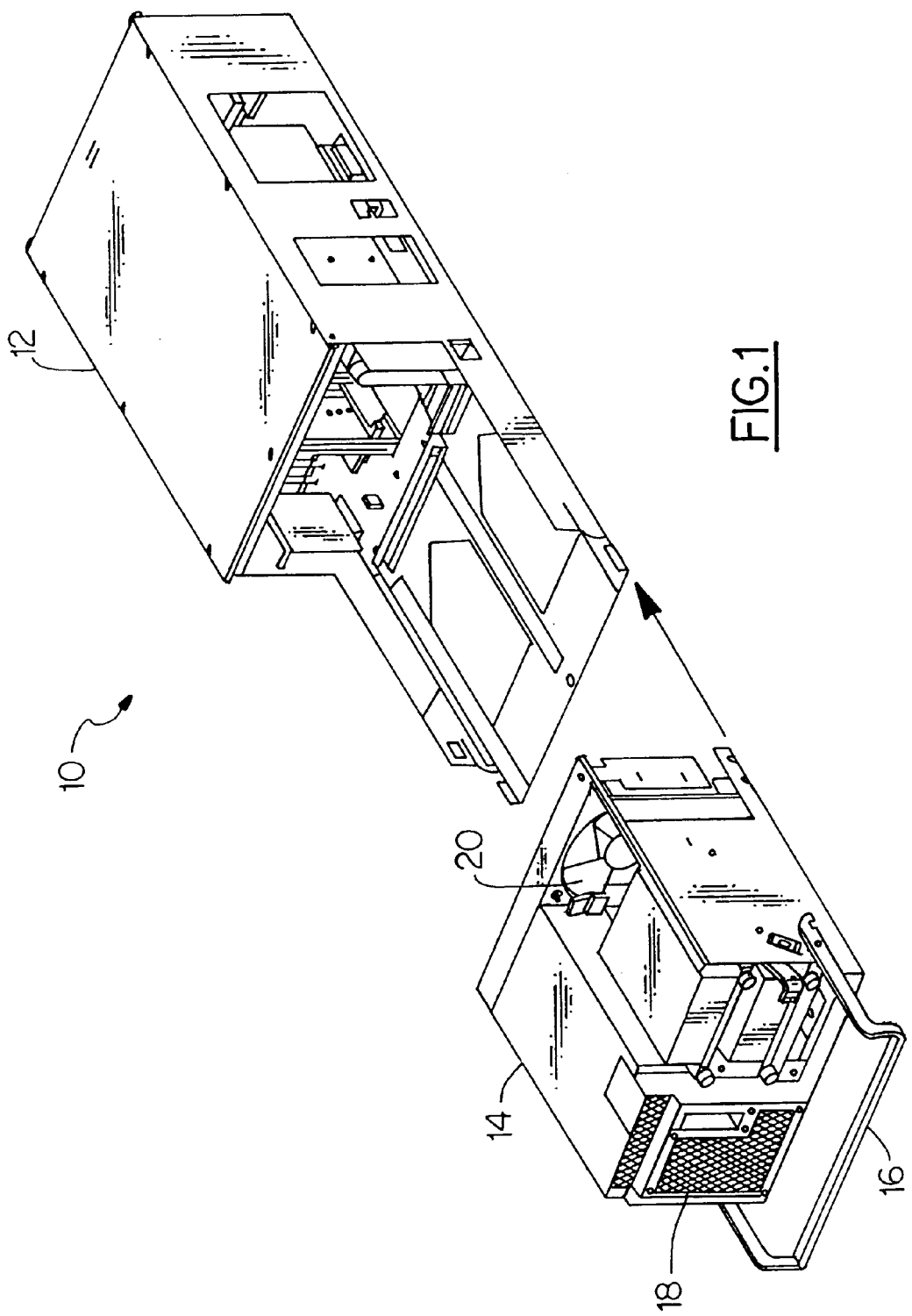
FIG. 1 is a perspective drawing of an enclosure for electronics which includes the present invention, the enclosure including a removable chassis having a cooling fan, and a logic chassis.

FIG. 1 is a perspective drawing of an enclosure 10 for electronics which is particularly useful for rack mounted computer systems. The enclosure 10 includes a logic module chassis 12 and a removable chassis 14 which is slidably engageable with the logic module 12 of form a unitary enclosure which may be placed into a rack with other like enclosures. The removable chassis 14 is slid into the logic module 12 and locked into place by the action of an engaging handle 16. The engaging handle 16 and its action is not a part of the present invention, and will not be discussed further.

In one embodiment, the present invention is incorporated in a computer having a modular enclosure assembled in accordance with U.S. patent application Ser. No. 09/063,990 to Ayd et al. for MODULAR NODE ASSEMBLY FOR RACK MOUNTED MULTIPROCESSOR COMPUTER (Attorney Docket No. (PO9-97-160); the chassis of enclosure are joined in accordance with U.S. patent application Ser. No. 09/063,836 to Ayd et al. for CAMMING MECHANISM FOR JOINING MODULAR ELECTRONIC ENCLOSURES (Attorney Docket No. PO9-97-174); the chassis of the computer enclosure are slidably engageable in accordance with U.S. patent application Ser. No. 09/063,989 to Ecker el al. for ABRASION CONTROL ON SLIDING ASSEMBLIES (Attorney Docket No. PO9-98-059); and the tailgate of the computer is constructed in accordance with U.S. patent application Ser. No. 09/063,991 to Ecker el al. for EXPANSION SLOT ALIGNMENT PINS (Attorney Docket No. PO9-98-076), all of which are owned by the assignee of the present invention and incorporated herein by reference.

The removable chassis, among other things, includes a power supply module 18, which supplies power to components in the removable chassis 14 and logic components in the logic module 12. The removable chassis 14 includes a cooling fan 20 powered by the power supply. It will be understood that the cooling fan, when the removable chassis 14 is seated in place in the logic module 12, draws cooling air through the components of the removable chassis 14, and blows cooling air into the logic module 12 for cooling components therein.

Figure 2:
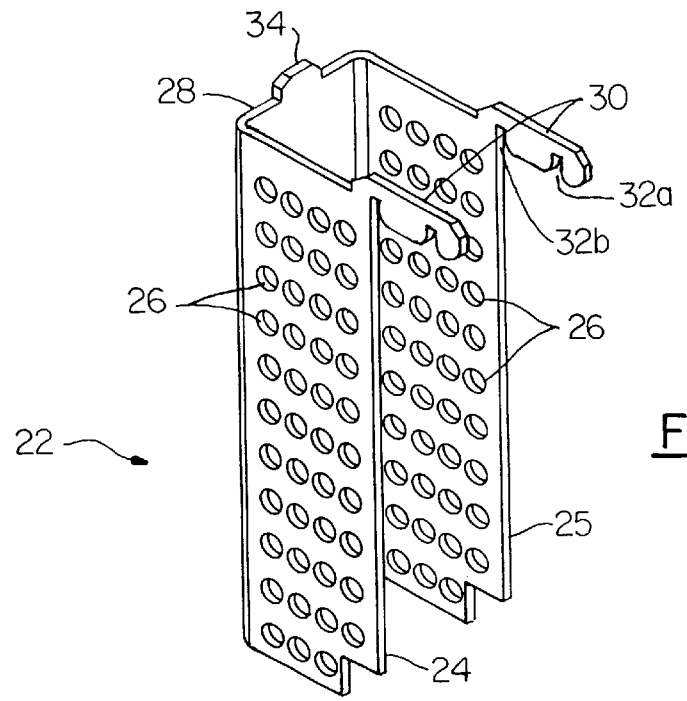
FIG. 2 is a perspective drawing of the baffle of the present invention.

FIG. 2 is a perspective drawing of a baffle 22 of the present invention for providing a constant impedance to the cooling air being blown into the logic module 12 by the cooling fan 20. The baffle 22 includes a pair of substantially parallel plates 24 and 25. The plates 24 and 25 each have a plurality of holes 26 arranged in a pattern to provide the impedance to air flow desired. The plates 24 and 25 are joined by a web member 28 which maintains the plates 24 and 25 at the desired separation and parallel orientation. Each of the plates 24 and 25 have a hanger tab 30 for hanging the baffle on a printed circuit board, as will be explained. Each of the hanger tabs 30 include a pair of slots 32a and 32b for fitting over the edge of a pair of printed circuit boards and are usable to act as spacers between the printed circuit boards. Finally, the web member 28 includes a tab 34 which extends above the top of the plates 24 and 25. The tab 34 is impinged upon by a foam pad 50 (see FIG. 5) to rotate the baffle 22 against the printed circuit board 37, holding the baffle 22 firmly in place.

Figure 3:
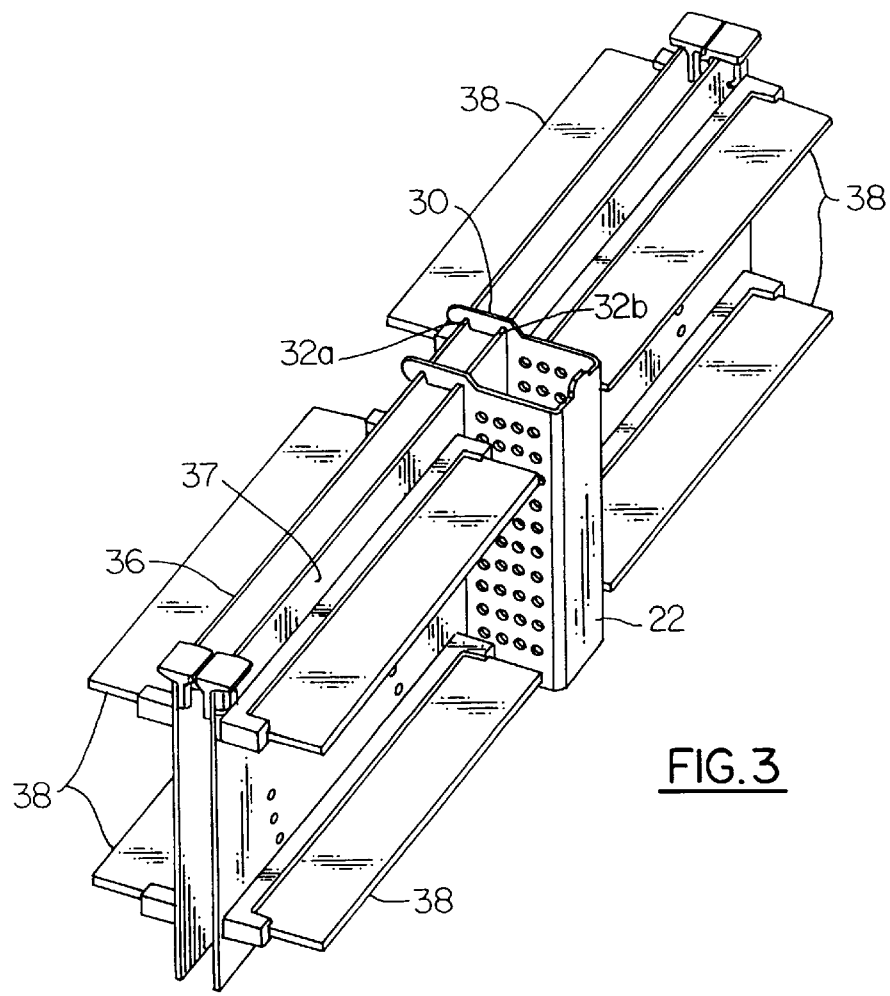
FIG. 3 is a perspective drawing of the baffle of the present invention installed on a pair of printed circuit boards, the printed circuit boards having a plurality of circuit cards to be cooled.

FIG. 3 is a perspective drawing of the baffle 22 of the present invention installed between a pair of printed circuit boards 36 and 37. Each of the printed circuit boards 36 and 37 have a plurality of circuit cards 38 mounted thereon, aligned in two columns. The circuit cards 38 may be Dual In-line Memory (DIM) cards for providing memory to a digital processing apparatus housed in the logic module 12. Each column of DIMs may hold, for example, a total of 8 cards, for a total of, for example, 16 DIMS on each printed circuit board. It will be understood that the number and arrangement of the DIMs on the printed circuit cards is illustrative only, and that other arrangements and numbers of cards may be used, as desired. There is sufficient room between the columns of DIMs to allow the baffle 22 to be dropped into place, as shown. To allow for a more compact arrangement of the DIMs, the printed circuit boards 36 and 37 are placed back-to-back, with the DIMs extending outwardly. Since the printed circuit boards 36 and 37 are relatively long, and are unsupported in the middle, they may flex sufficiently to allow the pins on the back of the boards to come in contact and short against each other. Thus, the hanger tabs 30 have slots 32a and 32b which receive the edges of the boards 36 and 37, respectively, when the baffle 22 is inserted into place. Thus, the hanger tabs 30 act as spacers between the printed circuit boards 36 and 37 to prevent, when in position, the boards 36 and 37 from flexing.

Figure 4:
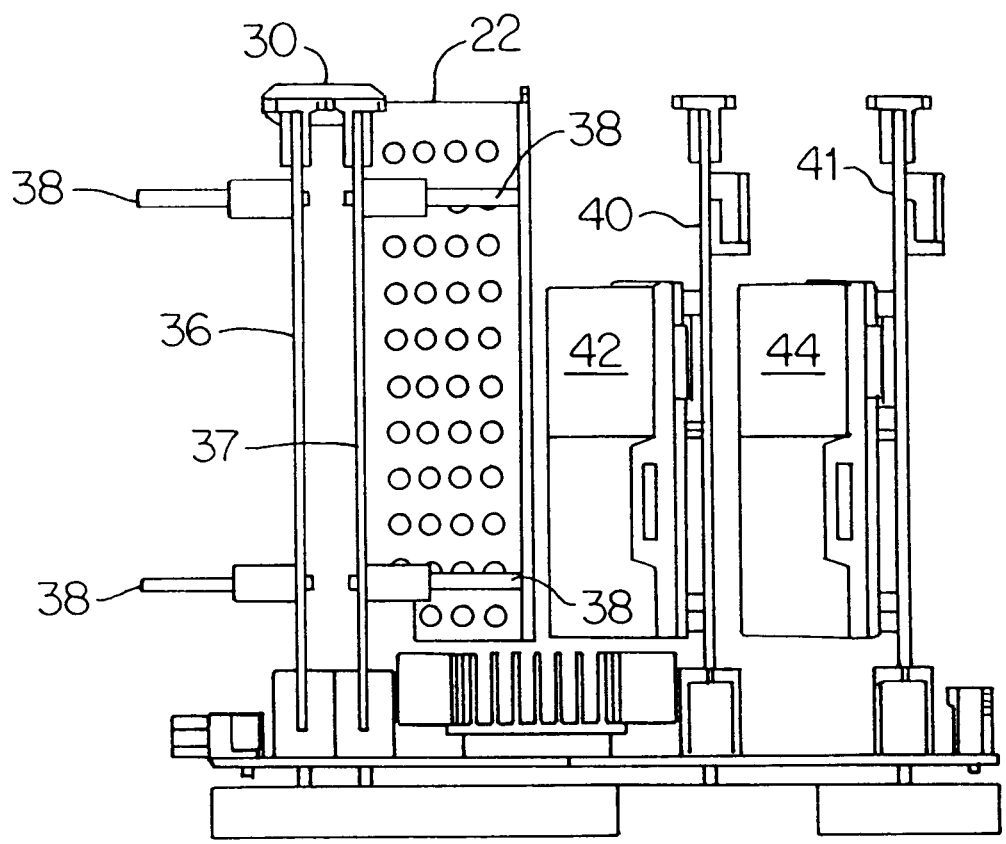
FIG. 4 is an elevational view of an end view of the electronic components to be cooled showing the baffle of the present invention installed.

FIG. 4 is an elevational end view of the logic module looking from the cooling fan end, with the air baffle 22 in place. The logic module 12 includes other boards 40 and 41 having components with heat sinks 42 and 44 mounted thereon. It will be understood that if the boards 36 and 37 are not fully populated with DIMs, an unacceptable amount of air would bypass the heat sinks 42 and 44. The insertion of the baffle 22 as shown in FIG. 4 causes an impedance to the air flow, causing air to be properly distributed throughout the logic module 12 such that the proper amount of air flows over the heat sinks 42 and 44.

Figure 5:
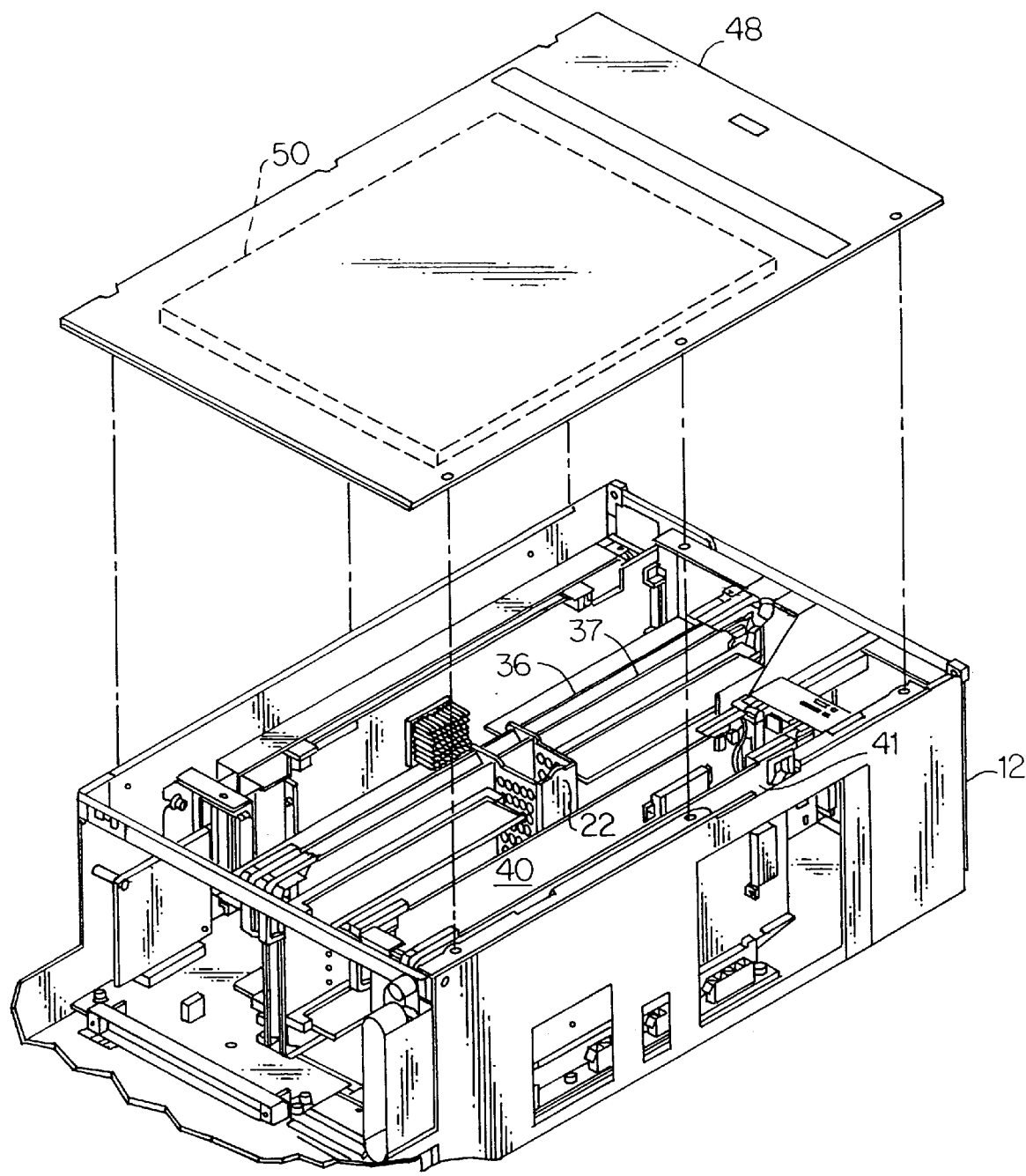
FIG. 5 is an exploded view of the logic chassis of the apparatus of FIG. 1 showing the baffle of the present invention installed.

FIG. 5 is an exploded view of the logic module 12 of FIG. 1. The logic module includes a cover 48 which closes the top of the logic module 12. A foam pad 50 is bonded to the underside of the cover 48, and which holds the boards 36, 37, 40, 41 and the baffle 22, as well as other boards and components in the logic module 12, in place.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. A constant air impedance device for use in an enclosure having a pair of side-by-side printed circuit boards, said device comprising:

a pair of substantially parallel plates, each having a plurality of through holes arranged in a pattern to provide a constant impedance to airflow therethrough;

a web member between said pair of plates for maintaining a set distance between said plates; and each plate having a hanger tab attached to one end thereof, wherein each hanger tab is capable of being used for hanging over the edge of said side-by-side printed circuit boards, each hanger tab having a pair of slots, one for each of said side-by-side printed circuit boards such that said hanger tabs maintain the spacing between the side-by-side printed circuit boards when the edges of each of said side-by-side printed circuit boards are engaged in said slots, respectively.

2. The constant air impedance device of claim 1 wherein said web member is of a size which maintains said set distance between said plates, such that the plates may be positioned between two columns of circuit cards mounted on one face of one of said side-by-side printed circuit boards.

3. A constant air impedance device, said device comprising:

a pair of substantially parallel plates, each having a plurality of through holes arranged in pattern to provide a constant impedance to airflow therethrough;

a web member between said pair of plates for maintaining a set distance between said plates each plate having a hanger tab attached to one end thereof, wherein each hanger tab is capable of being used for hanging over the edge of said side-by-side printed circuit boards, each hanger tab having a pair of slots, one for each of said side-by-side printed circuit boards such that said hanger tabs maintain the spacing between the side-by-side printed circuit boards when the edges of each of said side-by-side printed circuit boards are engaged in said slots, respectively; and an enclosure having a pair of side-by-side printed circuit boards and a removable cover, said cover further including a pad member bonded on said cover such that when said cover is attached to said enclosure, said pad member presses against the edges of said side-by-side printed circuit boards and presses against said hanger tabs to maintain said side-by-side parallel circuit boards and said parallel plates attached to said hanger tabs in place.

4. The constant air impedance device of claim 3 wherein a tab is attached to said web member on the same end of the device as said hanger tabs, said tab extending above the parallel plates and being impinged upon by said pad member, thereby imparting a rotational moment to said device, said rotational moment urging said device into said side-by-side printed circuit boards and firmly holding said device in place.

* * * * *